Feb. 1, 1966 A. SOMLYODY 3,233,083
ELECTRONIC COUNTER CIRCUIT
Filed Aug. 9, 1962
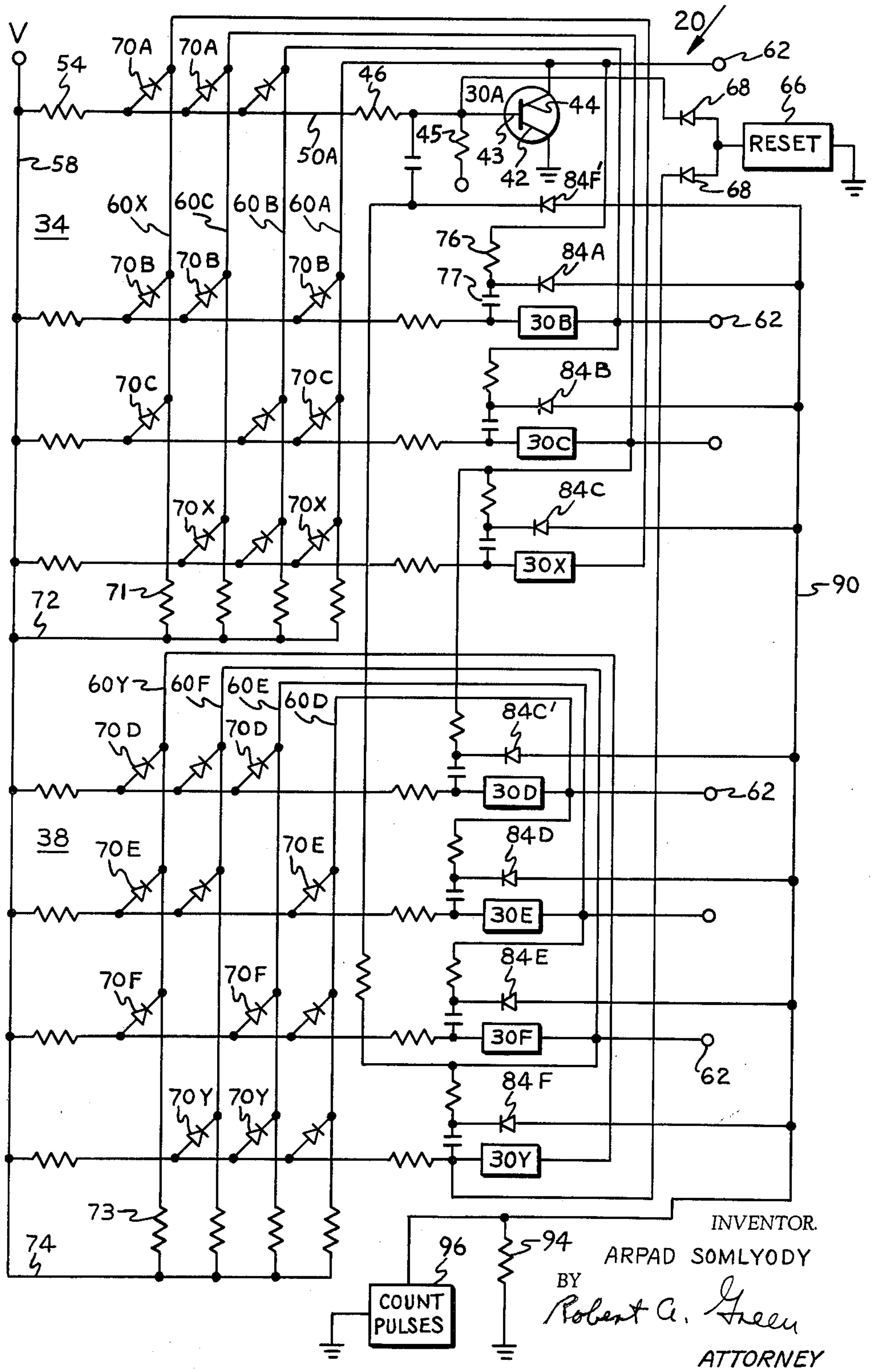
INVENTOR.
ARPAD SOMLYODY
BY
Robert A. Green
ATTORNEY

United States Patent Office 3,233,083

Patented Feb. 1, 1966

3,233,083

ELECTRONIC COUNTER CIRCUIT

Arpad Somlyody, Raritan, N.J., assignor to Burroughs Corporation, Detroit, Mich., a corporation of Michigan Filed Aug. 9, 1962, Ser. No. 215,922
7 Claims. (Cl. 235—92)

This invention relates to electronic counter circuits and particularly to semiconductor counter circuits utilizing diode matrices as components thereof.

One type of electronic semiconductor counter recently devised utilizes a diode matrix to transmit counting signals to a plurality of transistors, one transistor being provided for each counting stage. The diode matrix portion of the circuit may conveniently comprise semiconductor diodes, all prepared on a single semiconductor crystal. Theoretically, a counter of the type under consideration can comprise any number of counting stages; however, as the number of counting stages increases, the diode matrix utilizes more and more diodes and the construction of such a matrix on a single body of semiconductor material becomes undesirably complex.

Accordingly, the objects of the present invention concern the provision of a semiconductor counter having a large number of counting stages and utilizing a diode matrix arrangement of relatively simple construction.

Briefly, a counting circuit embodying the invention includes a relatively large number of count registering devices, each of which comprises a separate stage in a counting chain. The register devices are interrelated through a diode matrix to achieve the desired sequence in the counting or registering operation. According to the invention, the total diode matrix is divided into sections, each of which is related to a group of counting devices. Each diode matrix section and group of counting devices include auxiliary circuit means for holding the group inactive after it has completed a counting operation and while another matrix and group of register devices perform a counting operation.

The invention is described in greater detail by reference to the drawing wherein the single figure is a schematic representation of a circuit embodying the invention.

In order to simplify the description of the invention and the drawing, corresponding circuit elements are designated by the same reference numeral with a letter designation which is related to the counting step to which the circuit element belongs. In addition, since the counting devices are identical and some of the associated circuitry is identical, only one is shown in detail.

A counting circuit embodying the invention may include substantially any total number of count registering stages, with the stages being arranged in groups and each group being provided with its own diode matrix which is a smaller, simpler part of the whole. The circuitry required with such an arrangement is described below. Referring to the drawing, a counting circuit 20 embodying the invention includes a plurality of counting devices 30 arranged in two groups, one including counters 30A, 30B, 30C, and 30X, and the other including counters 30D, 30E, 30F, and 30Y. The first group of counters is coupled to a first diode matrix 34, and the second group is coupled to a second diode matrix 38.

The count registering devices 30 operate in the nature of switches and comprise, preferably, semiconductor devices such as transistors or the like. For convenience, NPN transistors are shown as the counter devices. Each transistor includes emitter, base, and collector electrodes 42, 43, 44, respectively. Each base electrode is coupled through a resistor 45 to a negative D.C. power source V*b* and through a bias resistor 46, lead 50 and resistor 54 to a bus 58 which is coupled to a positive D.C. power source V. Each emitter electrode 42 is connected to a source of reference potential such as ground.

Each collector or output electrode 44, except those of transistors 30X and 30Y, is provided with an output terminal 62, by means of which it may be connected to a suitable utilization circuit, for example, a cold cathode indicator glow tube. Each collector is also coupled through an output lead 60 to its diode matrix and through a diode 70 to the input or base electrode of every other transistor in its group of transistors.

Thus, lead 60A is coupled to diode matrix 34 and through diodes 70B, 70C, and 70X to the base or input electrodes of transistors 30B, 30C, and 30X, respectively. The output lead 60B from transistor 30B is similarly coupled to diode matrix 34 and through dides 70A, 70C, and 70X to the base or input electrodes of transistors 30A, 30C, and 30X. Transistors 30C and 30X are similarly coupled through diodes 70 to the input electrodes of the other transistors. The transistors 30D, 30E, 30F, and 30X are each similarly coupled through diodes 70 in diode matrix 38 to the input electrodes of the other transistors of their group.

The output leads 60A to 60X are also coupled through resistors 71 to bus 72 and then through bus 58 to power source V. Similarly, the collector leads 60D to 60Y are coupled through resistors 73 to bus 74 and then to bus 58 and power source V.

The counter 20 also includes suitable means for setting the counter to initiate a counting cycle or to reset the counter to initiate a new counting cycle. One suitable arrangement includes a source 66 of positive pulses coupled through diodes 68, oriented as shown, to the base electrode of transistor 30A, which is assumed to be the first stage in the counting cycle, and to the base electrode of transistor 30Y so that this transistor can be turned on at the same time that transistor 30A is turned on for a purpose to be described below. If desired, the reset operation may be performed by the application of a negative-going pulse to the collector electrodes of the aforementioned transistors 30A and 30Y.

Counting pulses to be registered in the circuit 20 are applied thereto by the following circuit means. The collector or output electrode of each transistor 30 is coupled through a resistor 76 and capacitor 77 to the base electrode of the adjacent transistor in the counting cycle. In this way, transistor 30A is coupled to transistor 30B; 30B is coupled to 30C; and 30C is coupled to 30X. In addition, according to the invention, the collector of 30C is coupled through resistor 76 and capacitor 77 to the input of transistor 30D. Similarly, transistor 30D is coupled to 30E; 30E is coupled to 30F; and 30F is coupled to 30Y. In addition, according to the invention, transistor 30F, which is assumed to be the last counting device in the counting cycle, is coupled through an R-C combination to the input of transistor 30A or to the input of the first transistor of the next group of transistors, if there is one.

The junction 80 of each resistor-capacitor combination is coupled through a diode 84, oriented as shown, to a bus 90 which is coupled both through a resistor 94 to ground and to a source 96 of positive counting pulses.

In operation of the circuit 20, the counter is prepared for executing a counting cycle by the application of a pulse through diodes 68 to the base or input electrodes of transistors 30A and 30Y, which are turned on thereby. When transistor 30A is turned on, its collector electrode is reduced in potential, to about ground potential, and this potential is coupled through output lead 60A and diodes 70B, 70C, and 70X to the input or base electrodes of transistors 30B, 30C, and 30X, respectively, which are held off thereby.

Similarly, when transistor 30Y is turned on and its collector electrode is reduced to about ground potential, this potential is coupled through output lead 60Y and diodes 70D, 70E, and 70F to the input electrodes of transistors 30D, 30E, and 30F, which are held off thereby. This off condition of transistors 30D to 30F is maintained during the time in which the first group of transistors, 30A to 30C, executes a counting cycle.

The proper counting sequence from transistor 30A to 30B to 30C, etc., is automatically carried out in the following manner. All of the collector electrodes of transistors 30 which are not executing a counting operation and which are thus held off, are at a relatively high positive potential. This positive potential is applied to the cathodes of the diodes 84, to which these collector electrodes are connected. At the same time, the anodes of these diodes are at approximately ground potential through their connections to bus 90. Thus, each of the diodes coupled to "off" transistors is reverse-biased by a relatively high reverse potential. Referring now to transistor 30A, which has been turned on, it can be seen that the ground potential of its collector electrode is applied to the cathode of diode 84A, and the high reverse potential, which existed across diode 84A before transistor 30A was turned on, is reduced to a low level or it is removed completely. Diode 84A is thus primed so that, when the next counting pulse is applied thereto by bus 90, this pulse is coupled through the diode to the base electrode of transistor 30B, which is turned on thereby. Because the other diodes 84 are reverse-biased, this counting pulse cannot affect any of the other transistors. The collector electrode of transistor 30B is now reduced to about ground potential, and this potential coupled through lead 60B and the various diodes shown, holds off all of the other transistors in its group. It also primes diode 84B to pass the next counting pulse to the base electrode of transistor 30C.

When transistor 30C is turned on by a counting pulse, the ground potential of its collector electrode reduces the reverse bias across diodes 84C and 84C' which is coupled between transistor 30C and transistor 30D of the next group. With this arrangement, the next counting pulse turns on transistor 30X, the last transistor of the first group, and transistor 30D, the first transistor of the next group. Transistor 30X does not register a count, but the ground potential of its collector electrode coupled through lead 60X and the diodes shown serves to hold off all of the other transistors of the first group. This condition continues during the entire counting cycle of the second group of transistors and any other groups of transistors which may be provided in the counting chain.

When the counting cycle reaches transistor 30F, the next counting pulse turns on transistor 30Y which holds off all of the other transistors of the second group, and, in addition, it turns on either the first transistor of the next group of transistors or it turns on again the first transistor 30A.

The present invention thus provides an efficient counter circuit which, although it may include a large number of counting stages, utilizes a diode matrix arrangement of relatively simple construction.

What is claimed is:

1. An electronic counter circuit including a plurality of groups of count registering devices, each having an input electrode and an output electrode, the devices in each group being arranged in a series and the groups being arranged in series so that a count registering operation can proceed from one device to the next in each group and from the devices in one group to the devices in the next group, a signal source coupled to the input of each count registering device, a diode matrix associated with each group of count registering devices and interconnecting said devices to control the performance of the count registering operation and to insure that one device at a time performs the count registering operation, and an auxiliary electron discharge device associated with each group of count registering devices and each diode matrix and having an input electrode and an output electrode, the output electrode of each auxiliary device being coupled through a diode to the input electrode of each count registering device in the group with which it is associated whereby an auxiliary discharge device can hold inoperative the count registering devices of its group while the count registering devices of another group perform a counting operation.

2. The counter defined in claim 1 wherein each counting device is coupled through a diode to every other device in its group whereby when one device is registering a count, the other devices of the group are prevented from registering a count.

3. The counter defined in claim 1 wherein the last counting device of one group is coupled both to the auxiliary device of its group and to the first counting device of the next group in the counting cycle whereby said first counting device of the next group can be turned on by a counting pulse and said auxiliary device of the one group holds inactive all of the counting devices of the one group.

4. The counter defined in claim 1 wherein each counting device includes input and output electrodes and the output of each device is coupled through a diode to every other device in its group whereby when one device is registering a count, the other devices of the group are prevented from registering a count, the output of each device in a group also being coupled to the input of the next adjacent device through a priming circuit whereby each device as it registers a count, primes the next device in the counting cycle to register the next count.

5. The counter defined in claim 1 wherein each counting device includes input and output electrodes and the output of each device is coupled through a diode to every other device in its group whereby when one device is registering a count, the other devices of the group are prevented from registering a count, the output of each device in a group also being coupled to the input of the next adjacent device through a priming circuit whereby each device as it registers a count, primes the next device in the counting cycle to register the next count, the last counting device of one group being coupled through a priming circuit both to the auxiliary device of its group and to the first counting device of the next group in the counting cycle whereby said first counting device of the next group can be turned on by a counting pulse and said auxiliary device of the one group holds inactive all of the counting devices of the one group.

6. The circuit defined in claim 1 wherein each counting device is coupled through a priming circuit to the next adjacent device in the counting cycle whereby each device as it registers a count primes the next device in the counting cycle to register the next count, said priming circuit comprising a series resistor and capacitor with the junction thereof being coupled to a source of reference potential and to a source of counting pulses, the diode representing a closed gate to counting pulses when it is between two counting devices which are not registering a count and an open gate when it is between a device which is registering a count and one which is not registering a count.

7. An electronic counter including a plurality of groups of counting stages, each including a transistor having base, emitter, and collector electrodes, a diode matrix coupled to each group of transistors with the collector electrode of each transistor being coupled through a diode to the base electrode of the other transistors in its group, each group of transistors including an auxiliary transistor which does not register a count but which is coupled through the diode matrix to all of the other discharge devices of its group to hold said other discharge devices inoperative while another group of devices performs a counting operation, each transistor of a group having its collector electrode coupled through a gating circuit to the base electrode of the next transistor in the counting cycle, the last counting transistor in each group being coupled through a gating circuit both to the first counting transistor of the next group and to the auxiliary transistor of its own group, and a source of counting pulses coupled through said gating circuits to each of said counting transistors and said auxiliary transistors, all of said gating circuits being blocked and preventing the passage of a counting pulse except a gating circuit which is coupled between a transistor which is registering a count and the next transistor in the counting cycle.

References Cited by the Examiner

UNITED STATES PATENTS

| | | | |
|---|---|---|---|
| 3,076,956 | 2/1963 | Hagan et al. | 307—88.5 |
| 3,087,075 | 4/1963 | Faulkner | 307—88.5 |
| 3,135,875 | 6/1964 | Leightner | 307—88.5 |
| 3,151,236 | 9/1964 | La Baume | 235—92 |
| 3,152,268 | 10/1964 | Somlyody | 307—88.5 |

MALCOLM A. MORRISON, *Primary Examiner.*